United States Patent [19]

Musa

[11] 3,956,708

[45] May 11, 1976

[54] MOSFET COMPARATOR

[75] Inventor: Fuad H. Musa, Tempe, Ariz.

[73] Assignee: Motorola, Inc., Chicago, Ill.

[22] Filed: Sept. 11, 1974

[21] Appl. No.: 505,195

[52] U.S. Cl............................ 330/30 D; 307/235 F; 330/22; 330/35
[51] Int. Cl.² ........................................... H03F 3/68
[58] Field of Search.................... 307/279, 304, 235; 330/22, 30 D, 35, 69

[56] References Cited
UNITED STATES PATENTS

| | | | |
|---|---|---|---|
| 3,581,226 | 5/1971 | Perkins et al. | 330/30 D |
| 3,676,702 | 7/1972 | McGrogan, Jr. | 307/235 |
| 3,852,679 | 12/1974 | Schade, Jr. | 330/30 D |

Primary Examiner—R. V. Rolinec
Assistant Examiner—Lawrence J. Dahl
Attorney, Agent, or Firm—Harry M. Weiss; Charles R. Hoffman

[57] ABSTRACT

A family of comparators are described which utilize only MOSFET transistors as the active devices. These comparators exhibit an infinite input impedance and zero input offset and bias currents. The circuits are capable of operating over a wide range of DC supply voltages at extremely low DC current drain. A comparator is shown which operates from a single positive DC supply voltage and which handles a wide range of input common mode (reference) voltages including some negative common mode voltages. Another comparator is shown which operates from a combination of a single positive and a single negative supply voltage and which handles a wide range of positive and negative input common mode voltage swings (references).

10 Claims, 7 Drawing Figures

P CHANNEL

N-CHANNEL

MOSFET COMPARATOR

BACKGROUND OF THE INVENTION

Prior art comparators typically utilize bipolar transistors for active devices. It is characteristic of such comparators to have relatively low input impedance and high input offset and bias currents. When operated from a single positive supply voltage, such comparators exhibit poor operation as the input common mode (reference) voltage approaches ground. Also, a typical one of these circuits cannot operate with a negative input common mode voltage.

In using the techniques described in greater detail hereinafter, it is possible to design a complete comparator circuit using only MOSFETs. No other type of components is needed in one such configuration. Another advantage of a comparator having a MOSFET differential amplifier over existing differential amplifiers is the extremely large input impedance which is characteristic of the gate to source impedance of MOSFETs. Since the MOSFET is a voltage driven device as contrasted to bipolar transistors which are current driven devices, extremely low offset and bias currents can be realized using MOSFETs for input transistors. A MOSFET differential amplifier exhibits a leakage current lying in the range of pico amps rather than in the range of nano amps as found in bipolar amplifiers.

With proper control of the threshold voltages of both the P and N-channel transistors, a CMOS differential amplifier operates with an extremely large input common mode voltage swing and thus allowing the comparator to operate over a wide range of reference voltages. When such an amplifier operates from a single positive supply voltage, it can operate with negative input common mode voltage signals. Such an operating mode cannot be easily obtained from bipolar amplifiers since $V_{BE}$ of both the NPN and PNP transistors is virtually equal.

Another advantage of a comparator using a CMOS differential amplifier is that true complementary symmetry can be obtained with a CMOS integrated circuit, while true complementary symmetry cannot be obtained when using bipolar transistors. It is common knowledge that good PNP transistors cannot be made in the same process as good NPN transistors. However, a good P-channel device can be made in the same process as a good N-channel device. Although a MOSFET device is considerably smaller than a bipolar transistor, comfortable gains are obtainable from these CMOS differential amplifiers.

The comparators described in this invention used CMOS differential amplifiers having MOSFETs for active loads. This characteristic offers the following advantages:

a. It makes it possible to design a comparator circuit with MOSFETs being the only components used.

b. It provides large load impedances and, hence, large voltage gain with relatively small chip area by increasing gate width(s) and operating the load devices in the saturation region.

c. Utilizing the MOS process technology, active devices can be fabricated to have a better match than passive components such as resistors. Therefore, using MOSFETs for active loads improves the input offset voltage characteristics of the differential amplifier. Since large load impedances are realized in small chip areas, low parasitic capacitances are associated with these loads which increases the amplifier's slewing rate, which improves the switching speed of the comparator and, hence, the range of reference voltages.

d. Input common-mode voltage swings can be improved by controlling the threshold voltages of the load devices.

A relatively high initial input offset voltage is characteristic of a CMOS differential amplifier as compared to a low input offset voltage as being characteristic of a bipolar differential amplifier. Statistical data obtained on recently integrated CMOS differential amplifiers have shown that input offset voltage drift with temperature is as good as those obtained from some bipolar transistors.

Various designs of CMOS comparators are described hereinafter that can be operated from either a single positive supply voltage or a single negative power supply voltage. It is possible to design a monolithically integrable CMOS comparator that can offer an extremely low power drain level and/or an extremely wide range of supply voltages.

SUMMARY OF THE INVENTION

This invention relates to a family of comparator circuits, and more particularly it relates to a family of comparator circuits using only silicon gate or metal gate MOSFET transistors as the active devices.

It is an object of the present invention to provide a family of comparator circuits having a virtually infinite input impedance and zero input offset and bias currents.

It is another object of this invention to provide a family of comparator configurations which are capable of operating within a wide range of DC supply voltages at extremely low DC current flow.

Another object of the present invention is to provide a family of comparator circuits in which all of the components are manufacturable through complementary MOSFET monolithic processes.

A still further object of the present invention is to provide a family of comparator circuits which are capable of operating from a single positive DC supply voltage while maintaining excellent operation over a wide range of input reference voltages, including operation with negative input reference voltages.

It is another object of the present invention to provide a family of comparators which can be supplied from a combination of a single positive DC voltage with a single negative DC voltage with operation over a wide range of positive and negative input reference voltage.

A further object of the present invention is to provide a comparator which is capable of operating from a single negative DC supply voltage which operates over a range of positive input common mode voltage swings.

Another object of the present invention is to provide a family of comparators which operate with a combination of a single positive and a single negative supply voltage, and which operate over a wide range of positive and negative input common mode voltage swings.

It is an object of this invention to utilize MOSFETs having a large impedance between its drain and source terminals and having a drain to source current independent of drain to source voltage as the constant current source in all comparator circuit configurations.

These and other objects and features of this invention will become fully apparent in the following description of the accompanying drawings wherein:

DETAILED DESCRIPTION OF THE INVENTION

Throughout the several Figures, the same numeral is used to identify the same component.

Figure 1A:
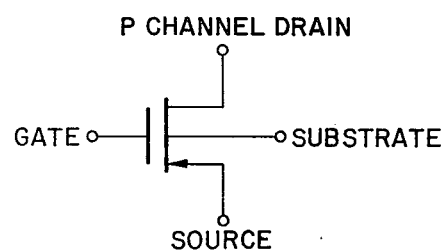
FIG. 1a is a circuit diagram designation of a P-channel MOSFET.

Referring to FIG. 1a, there is shown a P-channel MOS field effect transistor. The P-channel device operates in substantially the same way as the N-channel device. This transistor conducts current between its source and drain, when the following two conditions are satisfied: First, the drain is at a negative potential with respect to the source; and second, the gate is at a negative potential with respect to the source and this gate to source potential should exceed in magnitude a certain voltage called a threshold voltage of this device.

Figure 1B:
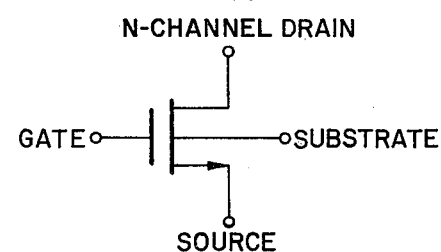
FIG. 1b is a circuit diagram designation of an N-channel MOSFET.

Referring to FIG. 1b, there is shown an N-channel MOS field effect transistor. The transistor conducts current between its drain and source, when the following two conditions are satisfied: First, the drain is at a positive potential with respect to the source; and second, the gate to source potential is positive and the gate to substrate voltage exceeds a certain voltage called a threshold voltage of that N-channel device.

The family of comparators described hereinafter comprise (a) a bias network, (b) a differential amplifier stage, (c) an intermediate stage, and (d) an output stage.

An ideal constant current source provides a current which is independent of the voltage drop across its terminals.

Figure 2:
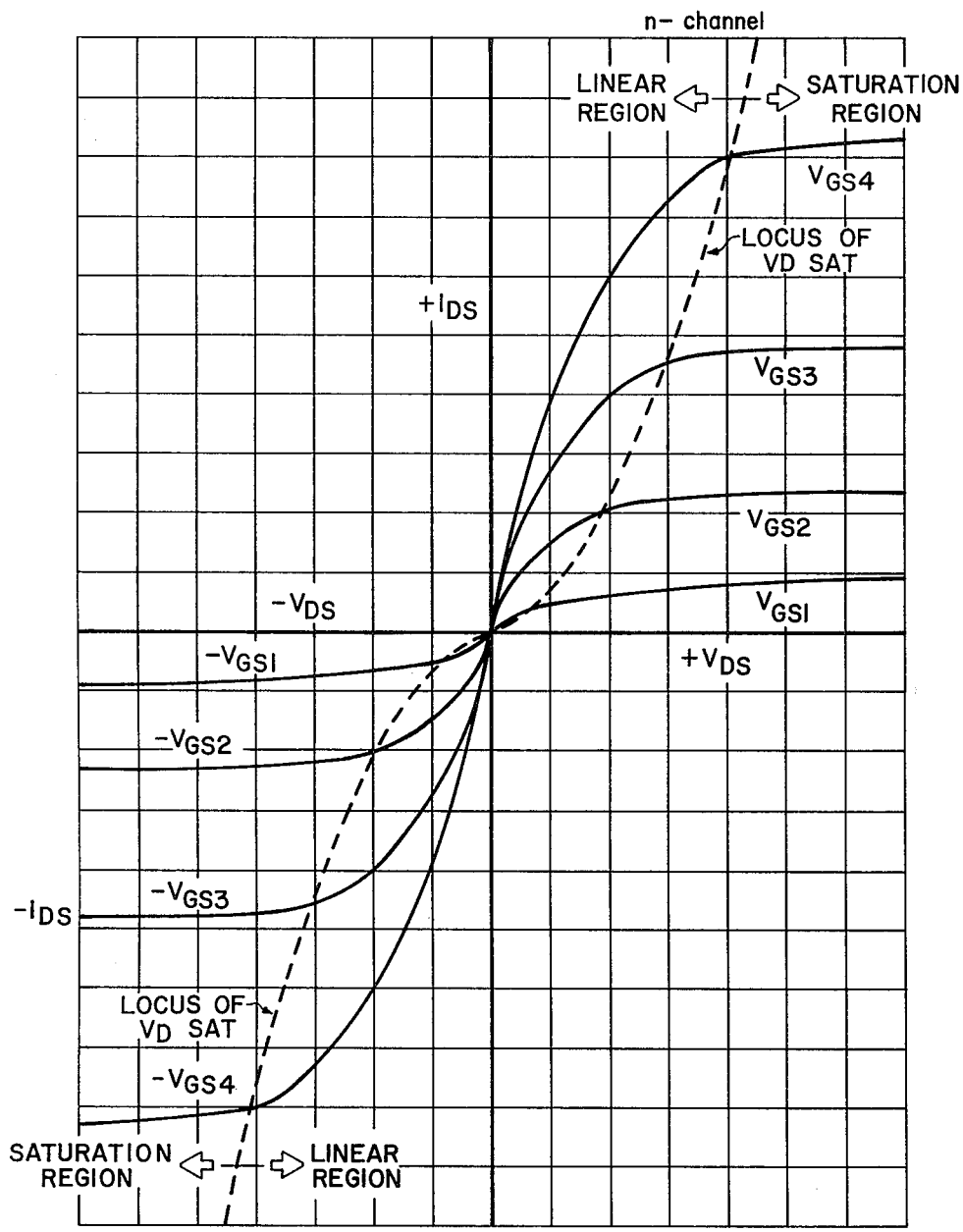
FIG. 2 shows a typical current-voltage relationship of N- and P-channel MOSFETs.

Reference is made to the typical MOSFET I-V relationships shown in FIG. 2. It is clear that in the saturation region, the drain-source terminals of a MOSFET provide near ideal current source. This is due to the fact that the drain to source current remains virtually constant as the drain to source voltage is varied. The magnitude of the current can be controlled, however, by adjusting the gate to source voltage. In the amplifier configurations embodied in this invention, the drain to source terminals of a MOSFET are utilized for a constant current source whose magnitude is adjusted by varying the gain to source voltage. In order to guarantee a MOSFET operation in the saturation region, the drain to source voltage should exceed a minimum value which is equal to the saturation voltage ($V_{DSAT}$) which is approximately equal to $V_{GS} - V_T$ where $V_{GS}$ is the gate-to-source voltage and $V_T$ is the threshold voltage which is controlled by such process parameters as impurity concentration, oxide thickness, flat band voltage, and surface trap density at the interface between gate oxide and the silicon in the channel region, etc.

For an ideal current source operation $V_{DSAT}$ must be minimized to allow operation at low drain to source voltages. Also, to allow ideal current source operation at large drain to source voltages, the drain to source breakdown voltage must be maximized.

In this context, the DC bias network is that which provides the proper DC currents and voltages to the rest of the comparator circuit, specifically the current source.

The bias network should: (1) insure that all MOSFETs in the comparator circuit, including current source, input, and load MOSFETs, operate in the proper mode of operation (all MOSFETs must operate in the saturation region); (2) allow for adjustment of total DC current drain; (3) allow proper operation over a wide range of temperature; (4) allow proper operation with process variations; (5) allow for a wide range of input common mode voltage swing; (6) allow proper operation over a wide range of DC supply voltages; and (7) provide a means of input voltage offset adjustment.

A suitable input stage to the differential amplifier should provide: (1) an infinite input impedance, (2) a zero input bias and offset currents, (3) a zero input offset voltage, (4) a relatively large voltage gain, i.e., greater than 20 db, (5) a low input noise characteristic, (6) a high slew rate, and (7) a large input common mode voltage.

The characteristic of MOSFETs is the large gate to source impedance. Therefore, a MOSFET operating in common mode configuration can be utilized effectively as an input transistor in a differential amplifier stage to provide an extremely large input impedance which is diminished only by gate oxide leakage current. Thus, leakage and input currents in the pico-amp region can be achieved. This provides several orders of magnitude reduction in input offset and bias current characteristics as compared to the existing bipolar differential amplifier, i.e., pico-amps rather than at best nano-amps.

Large gains can be obtained by maximizing the gate width to length ratio of the input MOSFETs, higher Z/L results in higher Gm, and by utilizing MOSFETs for active loads to provide the necessary large load impedances. This can be done with small load parasitic capacitance, thus, enhancing the slewing rate of the differential amplifier.

Also, by properly controlling the N-, P-channel MOSFET threshold voltages, a wide range of input common mode voltage swings can be obtained. Also, negative input common mode voltage operations can be obtained even when the differential amplifier is supplied from a single positive DC voltage. This is an advantage over bipolar amplifiers since the $V_{BE}$ drop is almost the same for NPN and PNP transistors.

A suitable intermediate stage 1. must provide some reasonable voltage gain,
2. must provide the necessary voltage level shifting to properly bias the output stage,
3. must have reasonably fast switching characteristics.

A suitable output stage 1. must provide the necessary voltages and currents to drive a specified load,
2. must have fast switching characteristics,
3. must be capable of a voltage swing equal to the supply voltages.

Figure 3:
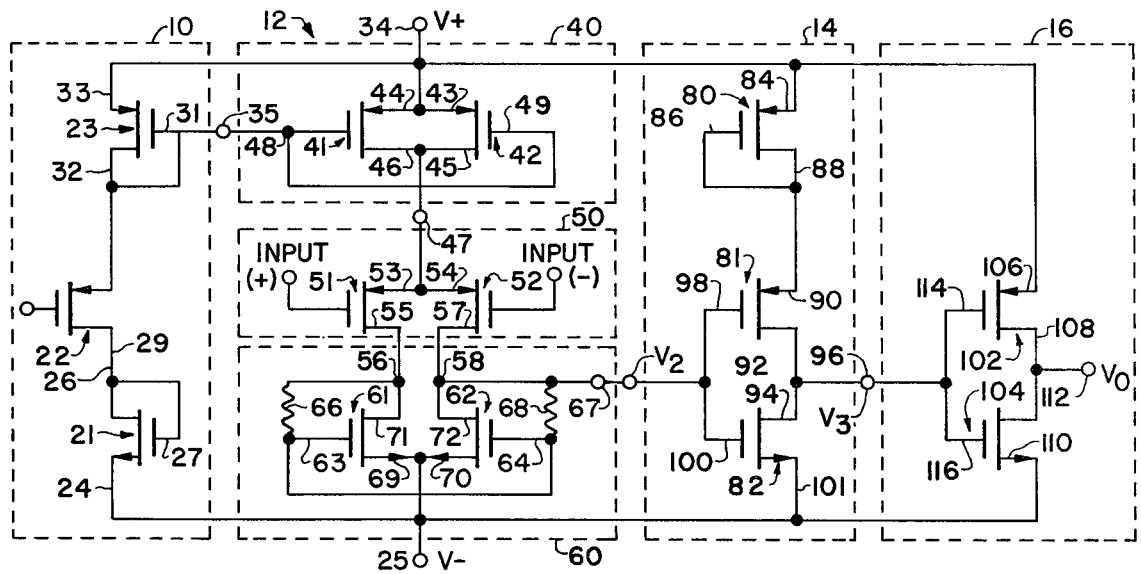
FIG. 3 is a schematic of a first embodiment of a comparator circuit.

Referring to FIG. 3, there can be seen a schematic view of a first comparator made according to the teaching of the present invention. Each of the comparators include a biasing means such as a biasing network 10, a differential amplifier 12, an intermediate stage 14 and an output stage 16. The differential amplifier also includes a constant current source 40, an input stage 50 and a load network 60.

The biasing network comprises a plurality of transistors 21, 22 and 23 and each include a source, drain and gate electrode. A source electrode 24 of the transistor 21 is connected to the minus voltage supply 25. A drain electrode 26 of the transistor 21 is connected to a gate electrode 27 of the same transistor 21 as well as a drain electrode 29 of the transistor 22. The source electrode 30 of the transistor 22 is connected to a gate electrode 31 and a drain electrode 32, respectively, of the transistor 23. A source electrode 33 of the transistor 23 is connected to the positive supply voltage indicated at a terminal 34. The gate electrode 31 of the transistor 23 provides the biasing voltage $V_B$ to the remaining portion of the differential amplifier at a biasing terminal 35.

The constant current source 40 comprises a pair of transistors 41 and 42 and each have source, drain and gate electrodes. A source electrode 43 of the transistor 42 is connected to a source electrode 44 of the transistor 41 and the common connection is connected to the positive voltage supply 34. A drain electrode 45 of the transistor 42 is connected to a drain electrode 46 of the transistor 41, and the common connection is connected to a constant current input connection 47 of the input stage 50. A gate electrode 48 of the transistor 41 is connected to a gate electrode 49 of the transistor 42.

The input stage 50 comprises a pair of transistors 51 and 52 and each have a source, drain and gate electrode. A source electrode 53 of the transistor 51 is connected to a source electrode 54 of the transistor 52 and, the common connection is connected to the current input connection 47. A drain electrode 55 of the transistor 51 is connected to a junction 56 and the drain electrode 57 of the transistor 52 is connected to a junction 58.

The load network 60 comprises a pair of transistors 61 and 62 and each have source, drain and gate electrodes. A gate electrode 63 of a transistor 61 is connected to a gate electrode 64 of the transistor 62. The gate electrode 63 is also connected to the junction 56 by a resistor 66. The gate electrode 64 of the transistor 62 is connected to an output terminal 67 by a resistor 68. A source terminal 69 of the transistor 61 is connected to a source terminal 70 of the transistor 62 and, the common connection is connected to a source of negative potential indicated at 25. A drain electrode 71 of the transistor 61 is connected to the junction 56 and a drain electrode 72 of the transistor 62 is connected to the junction 58.

The intermediate stage 14 comprises a plurality of transistors 80, 81 and 82. The source electrode 84 of transistor 80 is connected to the positive voltage terminal 34. A gate electrode 86 of the transistor 80 is connected to the drain electrode 88 of the same transistor and both are connected to the source electrode 90 of the transistor 81. The drain electrode 92 of the transistor 81 is connected to a drain electrode 94 of the transistor 82 and to an output terminal 96. A gate electrode 98 of the transistor 81 is connected to the gate electrode 100 of the transistor 82 and both are connected to the output terminal 67 of the differential amplifier.

The output circuit 16 comprises a pair of transistors 102 and 104. The source electrode 106 of the transistor 102 is connected to the positive voltage terminal 34.

The drain electrode 108 of the transistor 102 is connected to the drain electrode 110 of the transistor 104 and both are connected to the output terminal 112. A gate electrode 114 of the transistor 102 is connected to the gate electrode 116 of the transistor 104 and both are connected to the output terminal 96 of the intermediate stage 14.

Figure 4:
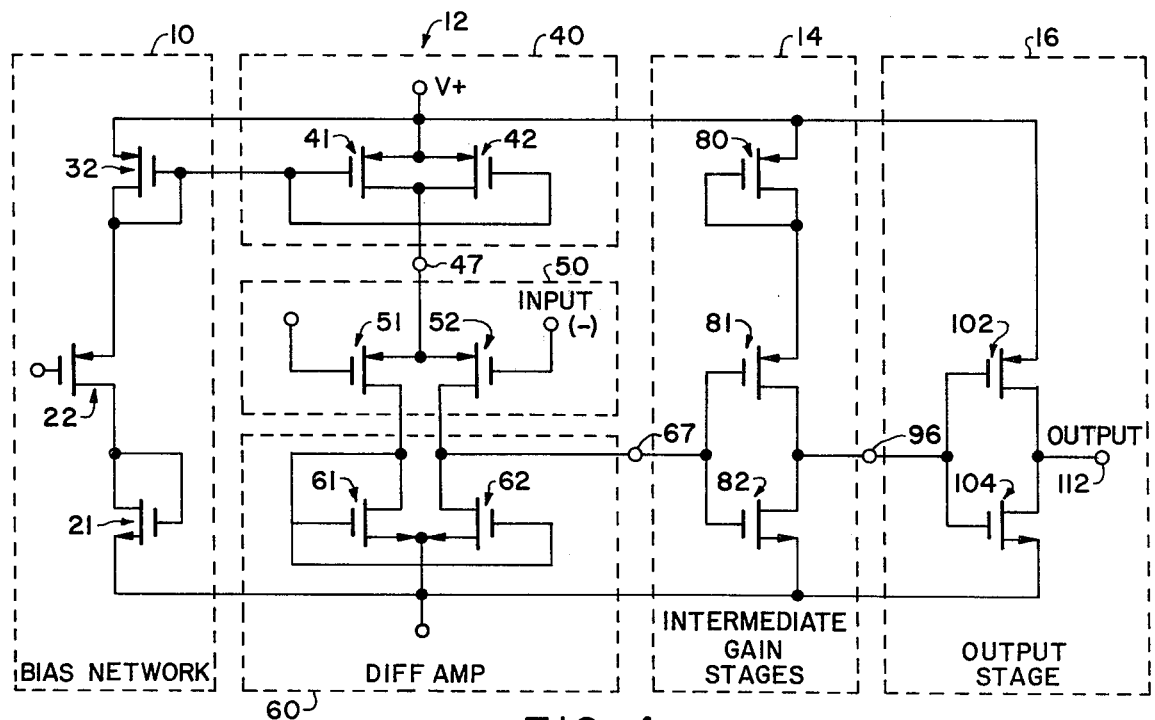
FIG. 4 is a schematic of a second embodiment of a comparator circuit.

The circuit shown in FIG. 4 differs from that shown in FIG. 3 only by the elimination of the resistors 66 and 68 in FIG. 3. Referring to FIG. 4, the removal of the resistor 66 is replaced by a straight line connection shown at 118. The removal of the resistor 68 has not been similarly compensated. The removal of these resistors means that the differential amplifier stage will be operating in an unbalanced configuration.

Figure 5A:
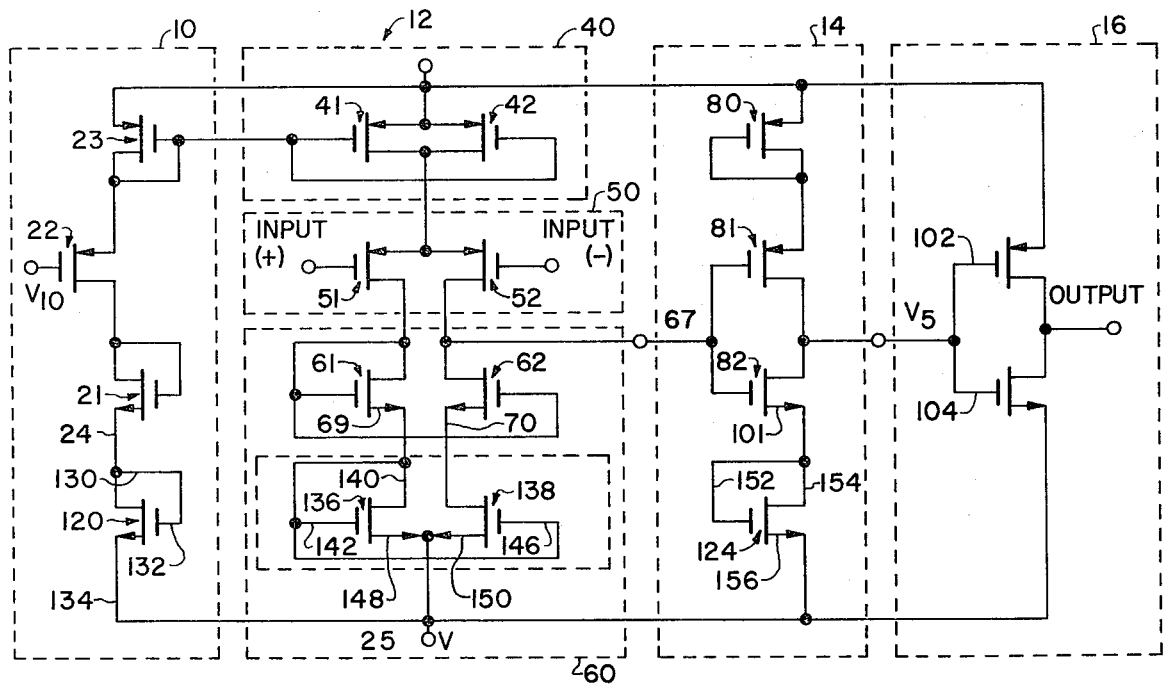
FIG. 5a is a schematic of a further embodiment of a comparator circuit.

Referring to FIG. 5a, there is shown a further embodiment of the comparator circuit. The circuit in FIG. 5 differs only from that shown in FIG. 4 by the addition of an additional transistor 120 in the biasing network, an additional stage 122 in the differential amplifier, and a corresponding additional transistor 124 in the intermediate stage 14. The transistor 120 has its drain electrode 130 connected to the source electrode 24 of the transistor 21. The gate electrode 132 of the transistor 120 is connected to the drain electrode 130. A source electrode 134 of the transistor 120 is connected to the negative power supply 25.

The load stage 122 comprises a plurality of transistors 136 and 138. Each of these transistors having source, drain and gate electrodes. The drain electrode 140 of the transistor 136 is connected to a gate electrode 142 of the same transistor as well as to the source electrode 69 of the transistor 61. The drain electrode 144 of the transistor 138 is connected to the source electrode 70 of the transistor 62. A gate electrode 146 of the transistor 138 is connected to the gate electrode 142 of the transistor 136. A source electrode 148 of the transistor 136 is connected to the source electrode 150 of the transistor 138 and both source electrodes 148 and 150 are connected to the negative voltage level at 25.

The intermediate stage 14 is equipped with an additional transistor 124 having source, drain and gate electrodes. A gate electrode 152 is connected to a drain electrode 154 and both are connected to the source electrode 101 of the transistor 82. A source electrode 156 of the transistor 124 is connected to the negative power supply terminal 25.

The circuit shown in FIG. 5a operates essentially as the circuit shown in FIG. 3 except a voltage level shift has been introduced and voltage at node 67 is approximately half way between the positive and negative supplies. Also, a higher voltage gain is obtainable from this circuit in comparison to the circuit shown in FIG. 3.

Figure 5B:
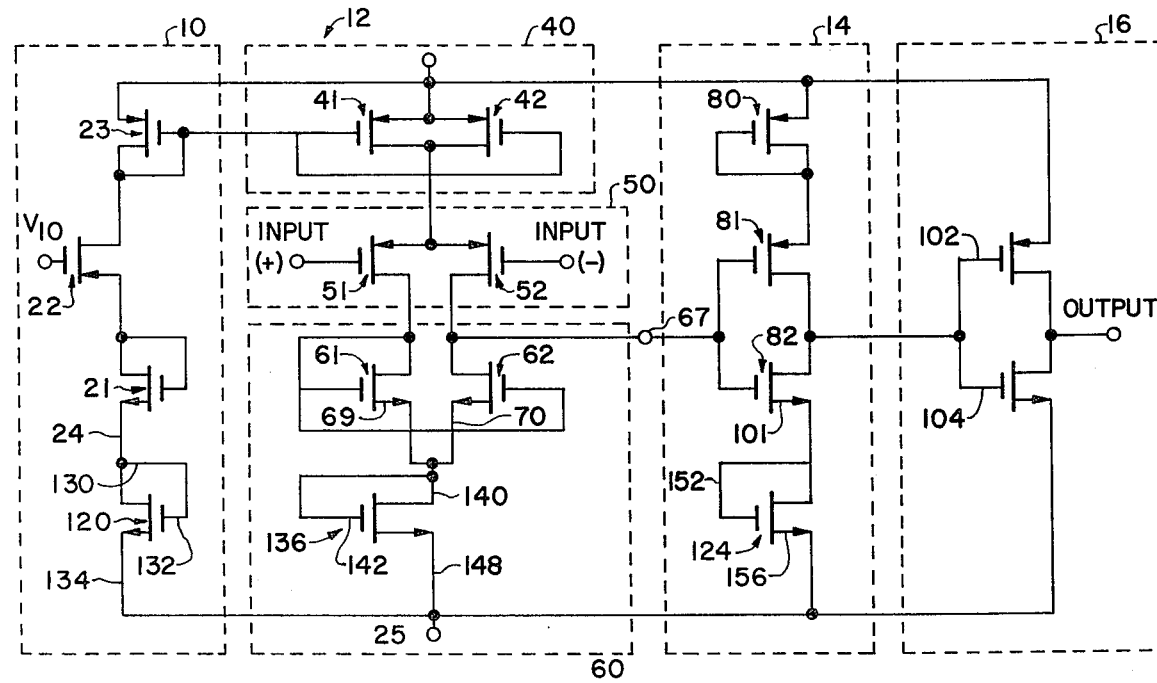
FIG. 5b is a schematic of a further embodiment of a comparator circuit.

FIG. 5b is essentially the same as the circuit shown in FIG. 5a except that the stage 122 comprises a single transistor 136'. This transistor provides the voltage level shift which is necessary to make node 67 voltage half way between the positive and negative supplies, thus guaranteeing that this intermediate stage 14 is in the amplifier region.

The circuit shown in FIG. 5a commonly has the V+ voltage level at +5 volts and the V− voltage level at −5 volts. In the quiescent condition when both input signals are equal, the output voltage at output terminal 67 is essentially at zero. Therefore, the circuit has increased sensitivity around its zero level. The addition of the transistors 136 and 138 changes the operating level at the terminal 67 to the zero level as opposed to being closer to V− or at a minus voltage output level.

Transistor 120 in the bias network and transistor 124 in the intermediate stage are added in order to balance out the remaining part of the circuit. For example, the addition of transistor 124 in the intermediate stage raises the normal bias point or voltage at V5 again to half way between V+ and V−. This is the correct bias condition for the output circuit consisting of transistors 102 and 104 to guarantee their operation to the saturation region. As previously mentioned, this biasing of transistors 102 and 104 to half way between V+ and V− allows the output circuit to swing both to the V+ level or the V− level.

OPERATION OF THE CIRCUIT

The comparator shown in FIG. 3 utilizes a differential amplifier which, with the exception of resistors 66 and 68, utilize only N and P-channel MOS field effect transistors. The values of resistors 66 and 68 can be within the range from less than a hundred kilohms to greater than 1000 megohms without appreciably affecting the performance of the amplifiers. The amplifier is designed primarily to operate from a single positive DC supply voltage. However, it can also be operated from two DC power voltages, one positive and one negative. All substrates of P and N-channel MOSFETs are connected to the most positive and most negative nodes in the circuit, respectively.

In reference to FIG. 3, the MOSFETs consisting of transistors 21, 22 and 23 form the DC biasing section 20. Transistors 41 and 42 form a constant current source 40. Transistors 51 and 52 form the input stage 50. Transistors 61 and 62 in combination with the resistors 66 and 68 are the loads for transistors 51 and 52, respectively. In order to insure proper operation of the differential amplifier, three sets of MOSFETs each consisting of three transistors must be reasonably well matched. The first set comprises transistors 23, 41 and 42. The second set comprises transistors 22, 51 and 52. The third set comprises transistors 21, 61 and 62. The gates of transistors 21, 22 and 23 are connected to their respective drains. This guarantees the operation of these transistors in the saturation region, provided that their gate to source voltage exceed the respective threshold voltages. Transistors 21, 22 and 23 operate together as a voltage divider providing the gate voltages to the transistors 41 and 42 which are connected in parallel. When operated in the saturation region, transistors 41 and 42 act as a constant current source. Each of the transistors 41 and 42 draws a current equal to that drawn by the transistor 23.

The gates, sources and substrates of transistors 61 and 62 are connected together, respectively. Therefore, if a voltage at terminal $V_1$ is set equal to the voltage at terminal $V_4$, then transistors 52, 51 and 62 and 61 draw equal amounts of current and the amplifier is in a balanced configuration.

To insure proper operation of the CMOS differential amplifier, transistors 41 and 42 must operate in the saturation region to provide a high current source with a constant current even with variations in the voltage at $V_3$ due to variations in voltage $V_1$ and $V_4$. Transistors 51 and 52 operate in the saturation region for maintaining linear amplifier performance.

Under ideal conditions, if the voltage at the two input terminals $V_1$ and $V_4$ are set equal, then transistors 51 and 52 and 61 and 62 draw equal amounts of current and the voltage at terminals $V_2$ and $V_5$ is equal. If a positive differential voltage is applied between terminals $V_1$ and $V_4$, that is if the voltage at terminal $V_1$ is at a higher positive potential than the voltage at terminal $V_4$, then transistor 52 wants to draw less current than transistor 51. Since resistors 66 and 68 draw a minimum current due to their extremely large values, then the transistor 62 still draws an equal amount of current as transistor 52 and transistor 61 draws an equal amount of current as transistor 51. The gate to source voltages of transistors 61 and 62 are equal since the two gates and the two sources of these transistors are tied, respectively. In order for transistor 62 to conduct less current, and become consistent with the current drawn in the transistor 52, the drain to source voltage across the transistor 62 is reduced in order for that device sustains a lower current flow. The opposite happens to transistor 61, in which case the drain to source voltage of transistor 61 is increased so that the transistor 61 draws an equal amount of current to that drawn by the transistor 51. As the voltage at terminal $V_1$ goes positive with respect to the voltage at terminal $V_4$, the voltage at terminal $V_4$ approaches the negative voltage and the voltage at terminal $V_5$ approaches the positive voltage. Therefore, there is a phase inversion between the voltages at terminals $V_1$ and $V_2$ and the voltage at terminals $V_1$ and $V_5$ are in phase. By symmetry, the voltages at terminals $V_4$ and $V_2$ are in phase but the voltages at terminals $V_4$ and $V_5$ are out of phase.

Since P-channel MOSFETs 51 and 52 form the two input stages for this amplifier, an extremely large input impedance is expected since the gate to source impedance of the MOSFET is extremely large. With the exception of some gate to source leakage current, the zero input bias and offset currents are characteristic of this circuit. Since MOSFETs exhibit extremely large impedances between their drain and source terminals when operated in the saturation region, the active loads consisting of transistors 61 and 62 provide an extremely large load impedance to transistors 51 and 52, respectively, thus guaranteeing a large voltage gain. The values of the resistors 66 and 68 are made large enough so that they do not affect the gain of the amplifier appreciably. Their values could be anywhere in the range of less than 100 kilohms to several thousand megohms.

Two MOSFETs, 41 and 42, are used for the constant current source 40 in this amplifier. Under ideal conditions, all transistors in this circuit are operating at the same current level when the two input voltages at terminals $V_1$ and $V_4$ are equal. Since transistors 23, 22 and 21 are operating in the saturation region, then for a large range of input common mode voltage, transistors 52 and 51 and 42 and 41 also operate in the saturation region.

The circuits shown in FIG. 3 provides a self-biased differential amplifier. No bias adjustment is necessary, other than an offset adjustment, when an extremely large input common mode voltage swing is expected. Since transistors 23, 22 and 21 continue to operate in the saturation region regardless of the supply voltage magnitude, this circuit, with the exception of the current drain, properly operates independent of the supply voltage variation. The only limitation here is that the supply voltages are large enough to turn the devices on and that they should be small enough so that the devices will not break down. This amplifier configuration provides a balanced output configuration. This feature makes it possible to use the output voltages at $V_2$ and $V_5$ as the input voltages to subsequent differential amplifier stages. The connection of cascaded differential amplifier stages may arise in the design of the high gain operational amplifier or high gain comparator.

It is to be noted that all substrates of all P-channel devices are connected to the most positive supply voltage and, substrates of all N-channel MOSFETs are tied to the most negative supply voltage. It is also to be noted that the amplifier shown in FIG. 3 can operate from a negative input common mode voltage. If the magnitude of the threshold voltage of transistors 52 and 51 exceeds the value of the voltage at $V_2$, then a negative input common mode voltage can be allowed. This feature for the magnitude of the negative input common mode voltage is enhanced by the fact that the substrate of the transistors 52 and 51 are tied to the most positive terminal which is B+, thus providing a back gate bias for the transistors 52 and 51. This increases the threshold voltage to these two transistors.

In general, the function of a comparator is well known. This function is generally to recognize the difference between a reference voltage and an input voltage. The reference voltage can be selected to lie at any point between the plus supply voltage and the minus supply voltage. Thereafter, the input signal is compared to this reference voltage and the comparator gives an output signal whenever the input signal either exceeds or is less than the reference voltage. Generally, when the reference voltage is greater than the input voltage, the output signal is high. When the reference signal is less than the input signal, the output signal is low. The comparator circuit requires an intermediate gain stage in order to provide a greater output voltage swing to the output circuit than is available from the differential amplifier. The differential amplifier is limited to a small swing between the minus supply voltage and the input signal. More specifically, the output signal from the differential amplifier stage cannot be greater than these two limitations. However, the intermediate gain stage is able to provide an output signal which swings essentially between the positive supply voltage and the negative supply voltage and only limited by one gate-to-source voltage drop away from each of these supply levels. This voltage swing drives the output circuit. The range of the output signal from the intermediate gain stage assures switching the output voltage between V+ and V− with minimum delay time after applying the input signal. The output stage process is an inherent delay unless the output signal is biased half way between the plus and minus supply voltages.

The addition of MOSFETs 120, 136, 138 and 124 provide balanced biasing conditions which guarantee that the intermediate stage 14 and the output stage 16 are operating in the amplifier regions where all MOSFETs in these stages are operating in the saturation region. This minimizes delay time and increases comparator sensitivity of input voltage levels in the neighborhood of the reference voltage. The reference voltage can lie anywhere within the input common mode voltage range of the differential amplifier.

In the several views, only one biasing network is shown. Several alternative biasing networks are shown in a copending U.S. Pat. Application entitled "Differential Amplifier", Ser. No. 505,101, filed Sept. 11, 1974, which is incorporated entirely by reference herein.

The intermediate gain stage in FIG. 3 and FIG. 4 can be modified by adding a resistor between the common gates of transistors 81 and 82 to their common drains. This resistor provides a current path in both directions. This serves two purposes. One is that the differential output is biased close to the intermediate stage switching point. The second is that all three transistors 80, 81 and 82, in the intermediate stage are biased in their saturation region. This insures that the high gain characteristics of this stage are not impaired because of current limiting to force one of the three transistors to operate in its linear region.

While there has been shown and described and pointed out the fundamental novel features of the invention as applied to the preferred embodiments, it will be understood that various omissions and substitutions and changes in the form and details of the structural element may be made by those skilled in the art withoug departing from the spirit of the invention.

what is claimed is:

1. A comparator comprising:
   a. a source of potential having at least a first and a second voltage level and said first level being more negative than said second level;
   b. a MOSFET biasing network connected between said first and second level of potential for providing a reference voltage;
   c. a MOSFET differential amplifier having a MOSFET constant current source responsive to said reference voltage from said biasing network for providing a constant current, and a MOSFET input stage being connected in series with said constant current source and having a first input terminal and a second input terminal for receiving two input signals to be compared and a MOSFET load network connected in series with said input stage, and an output terminal for providing a single differential output signal; and
   d. an output stage responsive to said single differential output signal for providing an amplified output signal, wherein said output stage includes:
   e. an N-channel MOSFET device having source, drain and gate electrodes;
   f. a first P-channel MOSFET device having source, drain and gate electrodes;
   g. a second P-channel MOSFET device having source, drain and gate electrodes;
   h. said source electrode of said N-channel device being connected to said first voltage level;
   i. said gate electrode of said N-channel device being connected to said gate electrode of said first P-channel device and said gate electrode of ssid N-channel device being further connected to said output terminal of said differential amplifier;
   j. said drain electrode of said N-channel device being connected to said drain electrode of said first P-channel device;
   k. said source electrode of said first P-channel device being connected to said drain electrode and said gate electrode of said second P-channel MOSFET device;
   l. said source electrode of said second P-channel device being connected to said second voltage level; and
   m. said junction of said drain electrode of said N-channel device and said drain electrode of said first P-channel device furnishing an output signal.

2. A comparator comprising:

a. a source of potential having at least a first and a second voltage level and said first level being more negative than said second level;

b. a MOSFET biasing network connected between said first and second level of potential for providing a reference voltage;

c. a MOSFET differential amplifier having a MOSFET constant current source responsive to said reference voltage from said biasing network for providing a constant current, and a MOSFET input stage being connected in series with said constant current source and having a first input terminal and a second input terminal for receiving two input signals to be compared and a MOSFET load network connected in series with said input stage, and an output terminal for providing a single differential output signal; and d. an output stage responsive to said single differential output signal for providing an amplified output signal, wherein said input stage comprises:

e. a first P-channel device having source, drain and gate electrodes;

f. a second P-channel device having source, drain and gate electrodes;

g. said source electrodes of said first and second P-channel device being connected together and being connected to said constant current source;

h. said gate electrode of said first P-channel device being adapted to receive a first input signal to be compared; and i. said gate electrode of said second P-channel device being adapted to receive a second input signal to be compared wherein said load network comprises:

j. a first N-channel device having source, drain and gate electrodes;

k. a second N-channel device having source, drain and gate electrodes;

l. said drain electrode of said first N-channel device being connected to said gate electrode of said first N-channel device and said gate electrode of said second N-channel device;

m. said source electrode of said first N-channel device being connected to said source electrode of said second N-channel device and to said first voltage level;

n. said drain electrode of said first N-channel device being connected to said drain electrode of said first P-channel device in said input stage; and o. said drain electrode of said second N-channel device being connected to said drain electrode of said second P-channel device in said input stage forming an output terminal.

3. A comparator as received in claim 2, wherein said load stage further comprises:

a. a first resistor being connected in series between said gate electrode of said first N-channel device in said load network and said drain electrode of said same device;

b. a first output signal being available at the junction of said first resistor and said drain electrode of said first N-channel device; and c. a second resistor being connected in series between said gate electrode of said second N-channel device in said load network and said drain electrode of said same device.

4. A comparator comprising:

a. source of potential having at least a first and a second voltage level and said first level being more negative than said second level;

b. a MOSFET biasing network connected between said first level and said second level of potential for providing a reference voltage;

c. a MOSFET differential amplifier having a MOSFET constant current source responsive to said reference voltage from said biasing network for providing a constant current, and a MOSFET input stage being connected in series with said constant current source and having a first input terminal and a second input terminal for receiving two signals to be compared and a MOSFET load network connected in series with said input stage, and output means for providing a single differential output signal;

d. amplifing means responsive to said output signal for providing an amplified output signal; and e. voltage shifting means positioned in said bias networks and in said differential amplifier and in said output stage for providing a balanced output signal from said amplifying means, wherein said biasing network includes:

f. an N-channel MOSFET device biasing source, drain and gate electrodes;

g. a first P-channel MOSFET device having source, drain and gate electrodes;

h. a second P-channel MOSFET device having source, drain and gate electrodes;

i. said source electrode of said N-channel device being connected said first voltage level;

j. said gate electrode of said N-channel device forming a junction with said drain electrode of said same device and that junction being connected to said drain electrode of said first P-channel device;

k. said gate electrode of said first P-channel device being adapted to receive an input offset and bias adjust signal;

said source electrode of said first P-channel device being connected to the junction of said gate electrode and said drain electrode of said second P-channel device;

m. said source electrode of said second P-channel device being connected to said second voltage level; and n. said junction of said gate electrode and drain electrode of said second P-channel device furnishing a reference current, and wherein said output stage includes:

o. an N-channel MOSFET device having source, drain and gate electrodes;

p. a first P-channel MOSFET device having source, drain and gate electrodes;

q. a second P-channel MOSFET device having source, drain and gate electrodes;

r. said source electrode of said N-channel device being connected to said first voltage level;

s. said gate electrode of said N-channel device being connected to said gate electrode of said first P-channel device and said gate electrode of said N-channel device being further connected to said output terminal of said differential amplifier;

t. said drain electrode of said N-channel device being connected to said drain electrode of said first P-channel device;

u. said source electrode of said first P-channel device being connected to said drain electrode and said gate electrode of said second P-channel MOSFET device;

v. said source electrode of said second P-channel device being connected to said second voltage level; and w. said junction of said drain electrode of said N-channel device and said drain electrode of said first P-channel device furnishing an output signal.

5. A comparator as recited in claim 4, wherein said input stage comprises:
 a. a first P-channel device having source, drain and gate electrodes;
 b. a second P-channel device having source, drain and gate electrodes;
 c. said source electrodes of said first and second P-channel devices being connected together and being connected to said constant current source;
 d. said gate electrode of said first P-channel device being adapted to receive a first input signal to be compared; and
 e. said gate electrode of said second P-channel device being adapted to receive a second input signal to be compared.

6. A comparator as recited in claim 5, wherein said load network comprises:
 a. a first N-channel device having source, drain and gate electrodes;
 b. a second N-channel device having source, drain and gate electrodes;
 c. said drain electrode of said first N-channel device being connected to said gate electrode of said frst N-channel device and said gate electrode of said second N-channel device;
 d. said source electrode of said first N-channel device being connected to said source electrode of said second N-channel and to said first voltage level;
 e. said drain electrode of said first N-channel device being connected to said drain electrode of said first P-channel device in said input stage; and
 f. said drain electrode of said second N-channel device being connected to said drain electrode of said second P-channel device in said input stage for forming an output terminal.

7. A comparator as recited in claim 6, wherein said load stage furthr comprises:
 a. a first resistor being connected in series between said gate electrode of said first N-channel device in said load network and said drain electrode of said same device;
 b. a first output signal being available at the junction of said first resistor and said drain electrode of said first N-channel device; and
 c. a second resistor being connected in series between said gate electrode of said second N-channel device in said load network and said drain electrode of said same device.

8. A comparator as recited in claim 7, wherein said voltage shifting means comprises:

a. a second N-channel device having source, drain and gate electrodes positioned intermediate said first N-channel device in said bias network and said first voltage level;
b. said gate electrode of said second N-channel device forming a junction with said drain electrode of said same device and said junction being connected with said source electrode of said N-channel device in said bias networks;
c. said source electrode of said second N-channel device being connected to said first voltage level.
d. a third N-channel device having source, drain and gate electrodes positioned intermediate said first N-channel device in said output stage and said first voltage level;
e. said gate electrode of said first N-channel device forming a junction with said drain electrode of said same device and said junction being connected with said source electrode of said first N-channel device in said input circuit; and
f. said source electrode of said third N-channel device being connected to said first voltage level.

9. A comparator as recited in claim 8, wherein said voltage shifting means further comprising:
 a fourth N-channel device source, drain and gate electrodes positioned intermediate said load network and said first voltage level;
 b. said gate electrode of said third N-channel device forming a junction with said drain electrode of said same device and said junction being connected with said source electrodes of said N-channel devices in said load circuit; and
 c. said source electrode of said fourth N-channel device being connected to said first voltage level.

10. A comparator as recited in claim 8, wherein said voltage shifting means further comprises:
 a. a fourth N-channel device having source, drain and gate electrodes;
 b. a fifth N-channel device having source, drain and gate electrodes;
 c. said drain electrode of said fourth N-channel device being connected to said source electrode of said first N-channel device, and said gate electrode of said fourth N-channel device being connected to said drain electrode of said fourth N-channel device and to said gate electrode of said fifth N-channel device; and
 d. said drain electrode of said fifth N-channel device being connected to said source electrode of said second N-channel device and said source electrode of said fifth N-channel device being connected to said source electrode of said fourth N-channel device, and the connection of said source electrode of said fourth N-channel device and said source electrode of said fifth N-channel device being connected to said first voltage level.

* * * * *